United States Patent [19]

Sweedler et al.

[11] Patent Number: 5,654,636

[45] Date of Patent: Aug. 5, 1997

[54] METHOD AND APPARATUS FOR NMR SPECTROSCOPY OF NANOLITER VOLUME SAMPLES

[75] Inventors: Jonathan V. Sweedler, Urbana; Timothy L. Peck, Champaign; Andrew G. Webb; Richard L. Magin, both of Urbana, all of Ill.; Nian Wu, Columbia, Md.

[73] Assignee: The Board of Trustees of The University of Illinois, Urbana, Ill.

[21] Appl. No.: 706,924

[22] Filed: Sep. 3, 1996

Related U.S. Application Data

[63] Continuation of Ser. No. 338,960, Nov. 14, 1994, abandoned.

[51] Int. Cl.$^6$ ..................................................... G01R 33/46
[52] U.S. Cl. .............................................. 324/321; 324/307
[58] Field of Search ...................................... 324/321, 300, 324/307, 318, 322; 422/70, 81; 436/161, 173

[56] References Cited

U.S. PATENT DOCUMENTS

| | | | |
|---|---|---|---|
| 4,737,711 | 4/1988 | Ohare | 324/300 |
| 5,092,973 | 3/1992 | Zare et al. | 204/182.1 |
| 5,141,609 | 8/1992 | Sweedler et al. | 204/180.1 |
| 5,192,412 | 3/1993 | Kambara et al. | 204/299 R |
| 5,210,036 | 5/1993 | Comb et al. | 435/194 |
| 5,214,380 | 5/1993 | Dumoulin | 324/307 |
| 5,283,036 | 2/1994 | Hofmann et al. | 324/321 |
| 5,338,687 | 8/1994 | Lee et al. | 324/307 |
| 5,384,249 | 1/1995 | Sasaki et al. | 435/85 |
| 5,414,508 | 5/1995 | Takahashi et al. | 356/246 |
| 5,423,513 | 6/1995 | Chervet et al. | 250/227.35 |
| 5,469,061 | 11/1995 | Linehan et al. | 324/321 |

OTHER PUBLICATIONS

Olson et al, "High Resolution Microcoil 'H-NMR for Mass-limited, Nanoliter Samples", Science vol. 270, pp. 1967–1970, (Dec. 1995).

Wu et al, "On–Line NMR Detection of Amino Acids and Peptides in Microbore LC, Anal." Chem vol. 67, No. 18, pp. 3101–3107 (1995).

Morita et al, "EDR of Submicroliter Aqueous Samples Using a Microcoil;" Journal of Mag. Res. vol. 102, pp. 344–347 (May) 1993.

Cho et al., "Nuclear magnetic resonance microscopy with 4–μm resolution: Theoretical study and experimental results," *Med. Phys.*15(6):815, 1988.

Sanny et al., "Microwave electron spin resonance spectrometer with operation to 54 mK in a diliution refrigerator," *Rev. Sci. Instrum.* 52(4):539, 1981.

Mahdjour et al., "High–sensitivity broadband microwave spectroscopy with small nonresonant coils," *Rev. Sci. Instrum.*57(6):1100, 1986.

Glover et al., "A microscope slide probe for high resolution imaging at 11.7 Tesla, " MRM, 31:423, 1994.

Tippie et al., "Low–temperature magnetism of quinolinium $(TCNQ)_2$, a randon–exchange Heisenberg antiferromagnetic chain," *Physical Reviews*, 23(11):5846, 1981.

Wiseman et al., "Biological application for small solenoids; NMR spectroscopy of microlieter volumes at high fields," *NMR in Biomedicine*, 6:153, 1993.

(List continued on next page.)

*Primary Examiner*—Sandra L O'Shea
*Assistant Examiner*—Raymond Y. Mah
*Attorney, Agent, or Firm*—Woodard, Emhardt, Naughton, Moriarity & McNett

[57] ABSTRACT

A method and apparatus for structural elucidation and determination of a nanoliter size sample of analyte. The method includes separating the analyte using a microseparation technique and then substantially simultaneously analyzing or detecting the sample using a nuclear magnetic resonance (NMR) spectrometer. The apparatus includes an RF microcoil positioned for operable communication with a capillary member of the microseparation system and the NMR spectrometer to provide enhanced sensitivity and improved signal-to-noise ratio of the NMR spectrometer necessary to accurately analyze or detect nanoliter size samples.

19 Claims, 7 Drawing Sheets

OTHER PUBLICATIONS

Hoult et al., "The sensitivity of hte Zeugmatographic experiment involving human samples," *Journal of Magnetic Resonance*, 34;425, 1979.

Wu et al., "Nanoliter volume sample cells for $^1$H NMR: application to on–line detection in capillary electrophoresis," *J. Am. Chem. Soc.*, 116(17), 1994.

Wu et al., "H–NMR spectroscopy on the nanoliter scale for static and on–line measurements," *Analytical Chemistry* 66(22), 1994.

METHOD AND APPARATUS FOR NMR SPECTROSCOPY OF NANOLITER VOLUME SAMPLES

This application is a continuation of application Ser. No. 08/338,960, filed Nov. 14, 1994, now abandoned.

This invention was made with Government support under NYI award CHE-9257024 and DIR-91 2419-2225 awarded by NSF. The Government has certain rights in the invention.

FIELD OF THE INVENTION

The invention relates generally to a method an apparatus for structural elucidation and determination of small volumes of analyte, and more particularly to a method and apparatus for in-line structural elucidation of nanoliter size samples of analytes separated by liquid based microseparation such as capillary electrophoresis (CE) or liquid chromatography (LC) and analyzed or detected by a nuclear magnetic resonance (NMR) spectrometer.

BACKGROUND OF THE INVENTION

Analyzing a substance and detecting its components is critical in many areas of science, particularly biochemistry. The substance to be analyzed or "analyte" typically is initially separated into its components and then each component is analyzed to identify the component.

The primary existing separation methods include liquid chromatography (LC), capillary based liquid chromatography and capillary electrophoresis (CE). The main difference between the capillary techniques is in the ability to provide efficient separations of much smaller volume samples, typically in the nanoliter range, which is several orders of magnitude less than the volume samples capable of being separated by conventional LC.

Analyzing the sample can be accomplished in a variety of ways. One of the preferred forms of analysis or detection is with a Nuclear Magnetic Resonance or NMR spectrometer since it provides a detection scheme rich with molecular information.

U.S. Pat. No. 5,283,036 to Hofmann et al. provides an apparatus for coupled liquid chromatography and nuclear magnetic resonance spectroscopy measurements. Such an apparatus, however, only is capable of analyzing samples in the 25–200 microliter (μL) volume range which is several orders of magnitude greater than the volumes obtained in micro-LC or CE.

NMR spectrometers typically are not able to analyze extremely small volume samples due primarily to their inherent low sensitivity. In order to increase the sensitivity of NMR spectrometers, smaller size RF coils typically are utilized but have yet to be developed for use with nanoliter size volume samples.

Additionally, existing RF coils typically have only been utilized with static systems where the sample to be analyzed must remain stationary for a prescribed period of time, known as the acquisition time. Such existing systems typically require an acquisition time of several minutes which significantly lengthens the process time.

It therefore would be desirable to provide a method and apparatus which combines capillary separations and NMR spectroscopy for analyzing nanoliter size samples in an in-line, substantially flowing system which provides a very short acquisition time.

SUMMARY OF THE INVENTION

The present invention provides a method and apparatus for structural elucidation and determination of nanoliter size samples of analyte. The nanoliter size samples substantially are simultaneously separated using micro-LC or capillary electrophoresis and analyzed or detected using an NMR spectrometer in a substantially in-line continuous flow system.

In order to provide increased sensitivity and improved signal-to-noise ratio of the NMR spectrometer, the invention includes an RF microcoil for operable communication with the NMR spectrometer. The RF microcoil preferably is formed from wire, such as copper wire, and is wrapped about the exterior of a separation capillary member usually formed of fused silica.

The RF microcoil preferably is formed with an inside diameter of less than 1 mm for use with samples less than 500 nanoliters and preferably 5 nanoliters. The NMR spectrometer typically includes a probe within which the RF microcoil and capillary member are mounted so that the microcoil and capillary member are positioned substantially perpendicular to the static magnetic field of the NMR spectrometer over the detection region of the capillary member.

Wrapping of the microcoil directly around the capillary member enables a good filling factor for detection of small samples, preferably samples in the 5–100 nanoliter sample range although some line broadening of the NMR spectra may occur. The line broadening may be minimized by the appropriate choice of materials and microcoil geometry.

Additionally, separation of the coil and sample from other circuit components minimizes the susceptibility of induced distortions of the static magnetic field in the local region of the sample.

By adjusting the size of the capillary member, the apparatus of the present invention also can be utilized for static NMR spectroscopy as well as LC applications.

Other features and advantages of the present invention will become readily apparent from the following description, the accompanying drawings and the appended claims.

BRIEF DESCRIPTION OF THE DRAWINGS

FIGS. 3a–3c are graphs of the NMR spectra, FIGS. 3a and 3b being two different configurations of the microcoil while FIG. 3c illustrates a reference NMR spectra;

DESCRIPTION OF THE PREFERRED EMBODIMENTS

Figure 1:
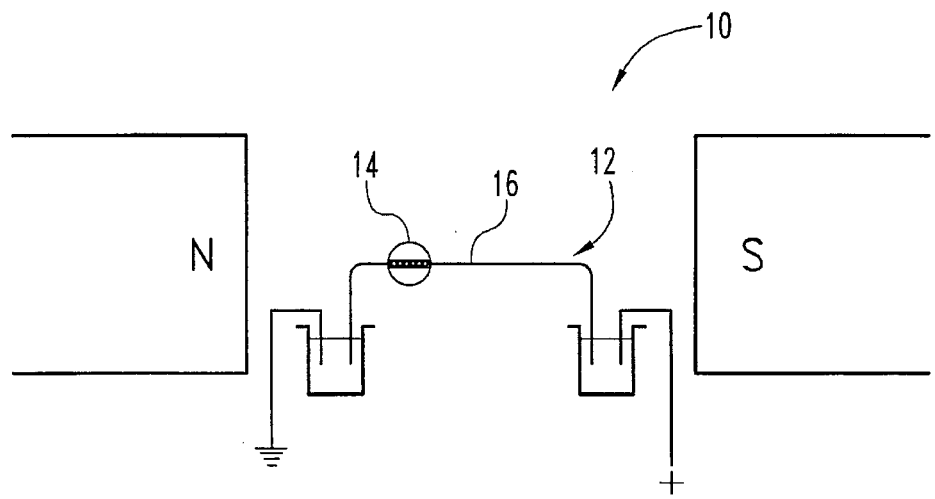
FIG. 1 is a schematic view of the apparatus of the invention positioned within a magnetic field of a NMR spectrometer.

While the present invention is susceptible to embodiment in various forms, there is shown in the drawings and will hereinafter be described a presently preferred embodiment, with the understanding that the present disclosure is to be considered as an exemplification of the invention, and is not intended to limit the invention to the specific embodiment illustrated.

For ease of description, the method and apparatus of this invention are described in the normal, upright, operating position and terms such as upper, lower, horizontal etc. are utilized with reference to this position. It will be understood, however, that the apparatus of this invention may be manufactured, stored, transported and sold in an orientation other than the position described.

Figure 2:
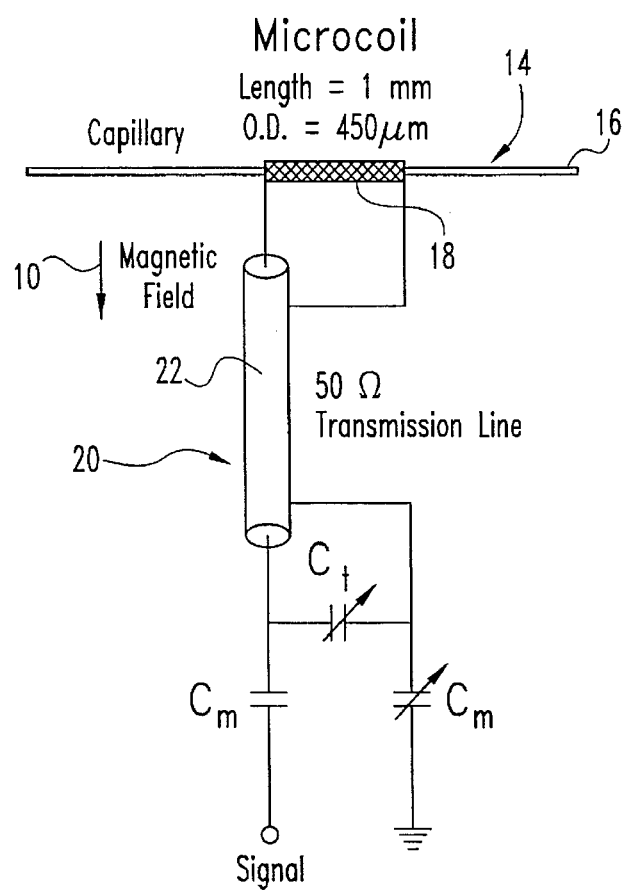
FIG. 2 is an enlarged schematic view of an NMR spectrometer probe including a microcoil and capillary member of the invention positioned within the magnetic field illustrated in FIG. 1.

Referring to FIGS. 1 and 2, a magnetic field of a nuclear magnetic resonance or NMR spectrometer (not illustrated) is generally designated by the reference numeral 10 and a system for capillary electrophoresis or CE is generally designated by the reference numeral 12. It is to be understood that the particular details of the magnetic field 10, the CE system 12 and the NMR spectrometer can vary so long as they function as described herein.

Positioned within the magnetic field 10 is an NMR probe generally designated by the reference numeral 14 for operable communication with the magnetic field 10 and the CE system 12. The probe 14 includes a capillary member 16 and an RF microcoil 18 which is in electrical communication with a desired electrical circuit 20.

Briefly, in use, the analyte to be detected is separated into respective analyte bands by the CE system 12 and flows through the capillary member 16. As the analyte bands flow through the probe 14 and the microcoil 18, the microcoil 18 cooperates to enhance the sensitivity and improve the signal-to-noise ratio of the NMR spectrometer as described in detail below to identify the analyte bands.

In NMR spectroscopy, the magnitude of the signal detected by the RF coil is directly proportional to the volume of the sample and the sensitivity of the RF coil. Optimal signal detection is achieved when the size of the RF coil is tailored to provide maximum magnetic field coupling between the RF coil and the sample. Thus, microcoils can be used to provide an enhanced signal-to-noise ratio (SNR) over that which can be achieved using larger RF coils.

The advantages of smaller coils for detecting NMR signals from flowing separation systems, as opposed to static separation systems with prescribed acquisition times, includes higher mass sensitivities and the ability to work with smaller volumes. The main challenge in designing a system for such smaller volumes is the lack of sensitivity of the NMR technique which is resolved by the present method and apparatus.

The general design criteria for the fabrication and performance optimization of RF microcoils used for NMR are modified in the present invention to take into account the additional requirements imposed by the separation. For example, the capillary member 16 preferably is formed from polyimide-coated fused silica with an inside diameter of between 50 and 500 μm. The microcoil 18 preferably is wrapped about the exterior surface of the capillary member 16 to a length of less than 1 mm.

Thus, the capillary member 16 serves as both the sample chamber and the coil form. It is to be understood, however, that the material and dimensions of the capillary member 16 and microcoil 18 can vary if desired.

For example, the capillary member 16 can be formed into a substrate from glass or other suitable material across which the analyte flows. The microcoil 18 then can be formed as a planar lithographic coil. Additionally, the capillary member 16 formed as a substrate can include one or more channels etched or grooved therein to serve as capillaries through which the analyte flows.

In optimizing the microcoil 18, the SNR of the microcoil 18 is maximized where the SNR is defined as the ratio of the peak intensity of the free induction decay (FID) signal (immediately following excitation) to the variance (root mean square) of the random noise. A high SNR is generally achieved using an optimized winding geometry of the coil (e.g., wire diameter, interturn spacing, and number of turns) and when the filling factor (the fraction of the interior of the coil filled with sample) is large.

The sensitivity of the microcoil or solenoid 18 is defined as the RF magnetic field intensity per unit current ($B_1/i$) and varies inversely with the diameter of the microcoil 18 provided that a fixed height-to-diameter ratio is maintained. Consequently, the sensitivity of an RF coil and its ability to receive a FID from a very small sample volume is enhanced when smaller coils that more closely conform to the sample are used.

Since thermal noise in the windings of the microcoil 18, not sample noise, is the primary contributor in microscopic studies, coil resistance must be minimized. Coil resistance depends on both the winding geometry (e.g., wire diameter and interturn spacing) and the resistivity of the conductor. Although the microcoil 18 is formed from standard gauge copper wire as described below, a significant improvement in SNR may be achieved using superconducting materials.

As the wall thickness of the capillary member 16 is reduced to increase the filling factor, the windings of the microcoil 18 (and the surrounding medium) come into closer proximity with the sample. Thus, the relative susceptibility variation in the materials surrounding the sample (e.g., the coil, air, glass, and capillary coating) leads to localized distortions in the static magnetic field to which the sample is exposed and results in line broadening of the NMR spectrum. The optimal microcoil 18 and sample geometries depend on many parameters, including coil performance, filling factor, and susceptibility considerations.

The apparatus of the present invention initially was designed with an iterative approach where a simple computer model was utilized to predict the SNR performance of the microcoil 18 for a water-filled capillary member 16. The microcoil 18 was then designed and the microcoil 18 and sample geometries were empirically adjusted to compensate for factors such as susceptibility variations.

Typically, the position of the microcoil 18 and sample can be adjusted to minimize susceptibility variations from external components (impedance matching capacitors, circuit boards, transmission lines, etc.). The windings of the microcoil 18 itself are the main source of susceptibility variation in the local region of the sample.

In theory, a sample enclosed by a perfectly uniform cylindrical shell would experience a uniform (albeit scaled in magnitude) static magnetic field. In order to closely approximate a cylindrical geometry, the interturn spacing of the microcoil 18 has been minimized.

The decrease in line width is accompanied by an increase in resistance of the microcoil 18 because of the greater number of coil turns positioned in close proximity to each other, and hence this degrades SNR performance. Additionally, the thicker walled capillary members 16 that provide substantial separation between the sample and the coil windings greatly increase the spectral resolution but at the cost of SNR reduction due to the reduced filling factor.

For example, a line width reduction occurs from greater than 1 ppm to less than 0.025 ppm (at 7.05 T) when a 17-turn microcoil 18 is utilized with nearly adjacent turns wound on a capillary member 16 with an inner diameter of 75 µm and wall thickness of 140 µm compared with an equal length, five-turn microcoil 18 with an interturn spacing of one wire diameter wound on a capillary member 16 of 75 µm inner diameter but with a wall thickness of only 30 µm. Detailed NMR results are provided below.

With regard to NMR band intensities, the effects of solution flow on the NMR spectrum arise because such flow changes the effective $T_1$ and $T_2$ of the sample. In a static NMR system, the optimum pulse repetition time is controlled by the spin-lattice relaxation rate, $T_1$.

With short delay times (rapid acquisition of multiple NMR scans), the signal becomes saturated because of insufficient time for the spins to return to equilibrium. In a flowing stream, the analyte is continuously being replaced, thus reducing the effect of saturation.

The effective $T_1$, $T_{1\mathit{eff}}$ of the system is given by $$\frac{1}{T_{1\mathit{eff}}} = \frac{1}{T_{1static}} + \frac{1}{\tau} \quad (1)$$

where $\tau$ is the residence time of the analyte in the detection cell.

Similarly, the flow also affects the effective spin-spin relaxation times, $T_{2\mathit{eff}}$ of the sample.

$$\frac{1}{T_{2\mathit{eff}}} = \frac{1}{T_{2static}} + \frac{1}{\tau} \quad (2)$$

Longer $T_2$ values indicate a narrower natural line width. A flowing sample degrades the line width because the NMR signal cannot be observed for a longer period than the residence time of the analyte in the cell.

Thus, faster flow rates enhance SNR performance by allowing faster pulse repetition but degrade the spectral line width. With the microcoil 18, the narrowest observable line width is limited by the hand-wrapped coils to ~10 Hz. Thus, the increase in the line width from analyte flow should have little effect on the observed line width until $T_{2\mathit{eff}}$ approaches 10 Hz.

Since this implies ~0.1-s analyte residence times, an increase in line width should not occur for the apparatus of the present invention. Additionally, the maximum signal intensity is obtained when the nuclei are prepolarized by being resident in the magnetic field to obtain a Boltzmann equilibrium (>5 $T_1$s). As the entire capillary member 16 is contained in the bore of the magnet, this is not a concern in the apparatus of the present invention.

On-line electrophoretic separations are inherently different from existing LC-NMR systems since the analyte in an on-line electrophoretic system is moving past the detector at a different rate and hence has a different residence time, $\tau$, in the detector cell. For an electropherogram measured between 3 and 30 min, there is a 1 order of magnitude difference in resident times.

Since NMR is a nondestructive detection technique, a variable acquisition time approach can be used where longer observation times are used for later eluting bands so that either more scans or a longer relaxation time between each scan can be used to increase the SNR of the later eluting bands.

The electric field and electrophoretic current can have a profound effect on the observed intensities of the individual analyte NMR bands. Although these effects are complicating factors, they are not considered a disadvantage since the dependence can yield molecular information which is difficult to obtain with other analytical methods.

Several possible complications include the fact that the orbits of the charge carriers are influenced by the main NMR magnetic field, $B_0$, and that the electrophoretic current produces a magnetic field gradient in the sample. The first effect is small for any orientation of the current and magnetic field as each molecular collision randomizes the direction and magnitudes of the velocities, with the exception of a small polarization of the molecules from the applied electric field.

Typically, the main magnetic field, $B_0$, is parallel to the direction of current flow so that the current-induced magnetic field has no component in the $B_0$ direction. In the present invention as illustrated in FIGS. 1 and 2, the electrophoretic current-induced magnetic field introduces a perturbation to the main magnetic field 10. The induced field gradient, however, is linear and external compensation can be used.

Resistive heating can be a problem in systems employing electrophoresis and NMR (E-NMR systems). The temperature rise degrades the separation efficiency and directly affects the electrophoretic mobilities and diffusion rates.

For aqueous samples, a >2% change in diffusion coefficient per degree temperature rise is expected. In CE applications, the temperature rise in the capillary member 16 can be greater than 10° C. One of the advantages of CE compared to previous large-scale electrophoretic systems is that the high surface-to-volume ratio minimizes the temperature gradient across the small-diameter capillary.

However, these thermal effects are the reason why the diameters of the capillary members cannot be increased to >100 µm without degrading the separation efficiency. Although all of the factors affecting the NMR band intensities are experimentally interrelated, equation 1 above predicts an improved SNR by increasing the solution flow rate because of the introduction of new spins. If the flow rate is increased, however, by increasing the applied voltage (and hence electrophoretic current), the increased temperature gradient across the capillary can offset the SNR gain resulting in an overall degradation of performance.

Details of the structure of the apparatus of the invention will now be provided.

The microcoil 18 preferably is formed as a multi-turn solenoid and is wound directly onto the capillary member 16. Other geometries and winding configurations of the microcoil 18, however, can be used including, but not limited to, saddle coils, surface coils, birdcage coils and coil arrays so long as they provide the desired increased signal-to-noise ratio, reduced susceptibility of distortion of the static magnetic field 10 and enhanced spectral resolution.

The microcoil 18 is wound directly onto the capillary member 16, preferably with 42 gauge (63.1 µm diameter) varnished copper magnet wire using a pin vice and micromanipulator under a stereomicroscope. Typically, 14–17 turns of wire are used to provide the microcoil 18 with a total detection length of between 0.9 and 1.1 mm.

In general, a bifilar winding technique is used where the diameter of the secondary wire is chosen to provide an adequate interturn spacing for the microcoil 18. Accordingly, a uniformly wound microcoil 18 with a constant value of interturn spacing is achieved after removal of the second wire.

The use of a single-wire, tightly wound microcoil 18 minimizes susceptibility-induced static magnetic field distortions. Variations of the geometry of the microcoil 18 can include the use of a secondary wire that remains open circuit on the coil form or that is driven in parallel with the primary wire.

To begin the winding process, one end of the wire is secured to the capillary member 16 using a small droplet of adhesive, such as epoxy, and then weighted to maintain constant tension. The wire is slowly wound onto the capillary member 16 by gently rotating the pin vice.

When the appropriate number of turns has been wound onto the capillary member 16, the wire is secured using a second droplet of epoxy or other adhesive. Although the presence of the adhesive does lead to susceptibility-induced line broadening of the NMR spectrum, this effect is minimized by restricting the use of epoxy to the ends of the microcoil 18.

Upon disconnecting the weights, the completed microcoil 18 is electrically connected to a semirigid coaxial cable 22 (such as that available from the Roseberger Micro-coax company of Collegeville, Pa., part number UT85SS) by solder, conductive epoxy, silver paint or the like. The impedance matching capacitors that match the microcoil 18 to the 50-Ω transmission line generally have a nonzero value of susceptibility and can lead to substantial (>3 ppm) line broadening of the NMR spectrum.

Therefore, the impedance matching capacitors are placed at the opposite end of the 3-cm section of coaxial cable 22. The degradation in the electrical performance of the circuit that results from separation of the tank circuit elements (i.e., coil and impedance-matching capacitors) is offset by the narrower line widths in the NMR spectrum.

The microcoil 18 is tested using a HP8751A network analyzer and HP87511A S-parameter test set (Hewlett-Packard, Palo Alto, Calif.) by measuring the input reflection coefficient ($S_{11}$) to accurately impedance match the circuit to 50Ω at 300 MHz. The microcoil 18 is then mounted in the probe 14, which is an in-house modified probe, in which the capillary member 16 and microcoil 18 are perpendicular to the static magnetic field 10 over the detection region. It is to be understood that the particular size, shape and dimensions of the probe 14 can vary so long as it functions as described herein.

To ensure against damaging the RF amplifier by the high voltages used in CE, the separation voltage is kept below the calculated breakdown voltage of the silica walls of the capillary member 16 at the position of the microcoil 18. For example, a maximum separation voltage of 12.5 kV is used with a 48-cm-long capillary (an electric field of 260 V/cm) with an inner diameter of 75 µm and an outer diameter of 355 µm (140-µm walls) with the microcoil 18 positioned 8 cm from the grounded end.

With such an arrangement, the potential at the microcoil 18 never exceeds 2 kV, and the intensity of the electric field across the wall of the capillary member 16 (150 kV/cm) remains below the 250–400 kV/cm dielectric breakdown specification of the capillary member 16. Additional testing of fidelity and breakdown potential of the capillary member 16 can be provided by application of 12.5 kV to the capillary member 16 with a buffer solution in a darkened room both for visual inspection of arcing and to monitor the CE current just prior to insertion into the magnet This additional testing is important following repeated experiments since a minute amount of buffer solution can leak onto the surface of the dielectric separating the anode and cathode in the probe assembly, leading to potential arcing in the probe. Furthermore, any abnormal electrophoretic leakage current is readily measured at the high-voltage power supply and may indicate that the capillary member 16 had been damaged during the construction of the microcoil 18 or mounting and positioning of the capillary member 16.

As FIG. 2 illustrates, the capillary member 16 and microcoil 18 are mounted so that they are substantially perpendicular to the static magnetic field 10 over the detection region.

Wrapping the microcoil 18 directly around the capillary member 16 provides a good filling factor for detection of a 5 nL sample size. Placing the microcoil 18 in direct proximity to the capillary member 16, however, increases the possibility of susceptibility induced line broadening. The degree of line broadening, however, can be minimized by the appropriate choice of materials and geometry of the microcoil 18.

As FIG. 1 illustrates, the microcoil 18 is separated from the electrical circuit 20, which typically includes impedance matching network components, with a transmission line 22 preferably formed from a length of 50Ω semi-rigid coaxial transmission line. Separation of the microcoil 18 and the analyte from the other components of the electrical circuit 20 tends to minimize susceptibility induced distortions of the static magnetic field in the local region of the sample analyte. It is to be understood, however, that other arrangements for matching the impedance and reducing distortions can be utilized.

NMR spectroscopy experiments were conducted using a GN-300 (7.05 T)/89 mm NMR spectrometer including Mac-NMR software available from Tecmag Corp., Houston, Tex. The maximum sensitivity, i.e., signal-to-noise per square root of total data acquisition time of the NMR experiments were obtained using an excitation pulse and interpulse repetition delay that both approach zero.

This method, however, leads to distortions of the line shapes in the NMR spectra. So long as the repetition delay is optimized for the particular choice of tip angle of the excitation pulse, there is negligible degradation in the sensitivity (i.e., <5%). In most experiments conducted, a tip angle of 50° and a pulse repetition time of 2–3 s were used, based on the effective $T_1$ values of the flowing spins.

For CE, the system generally is illustrated in FIG. 1 and substantially consists of an enclosure, preferably formed from acrylic, at the end of the NMR probe 14 with connections for the high-voltage and ground platinum electrodes. The particular design of the CE system, however, can vary.

The acrylic enclosure includes a safety cap (not illustrated) to prevent the superconducting magnet from contacting the high voltage. A 0–30-kV CE power supply (not illustrated) available from Bertan Associates, Inc., of Hicksville, N.Y. is located outside the superconducting magnet and the inlet of the separation capillary member 16. Inlet and outlet CE buffer reservoirs are located within the probe 14.

Separations can be performed using either a 48-cm-long (40 cm to the detector) 75 µm i.d.×355 µm o.d. fused silica capillary member 16 or a 30-cm-long (22 cm to detector) 75 µm i.d.×135 µm o.d. fused silica capillary member 16 available from Polymicro Technologies, Phoenix, Ariz.

The injection is performed with the probe 14 outside the magnetic field 10 and involves placing the inlet end of the capillary member 16 into a sample vial and raising the vial 15 cm over the outlet end for 30 s therefore injecting approximately 20 nl of sample. This separation represents more than a two order of magnitude reduction in sample volume over existing NMR systems.

Immediately following injection, the probe 14 is inserted into the magnet, and the high voltage and NMR acquisition is started. Dynamic elution of the electrophoretic buffer under pressure is achieved using a Harvard Apparatus syringe pump (Model 55-2222 available from Harvard Apparatus, South Natick, Mass.). With this system, flow rates in the range of 1–10 nL/s are obtained.

The $^1$H-NMR internal standard of 3-(trimethylsilyl)-1-propanesulfonic acid, sodium salt (DDS), deuterated boric acid (98% D), deuterium oxide (99.9% D), deuterium chloride (100% D), and sodium deuteroxide (40 wt % solution in $D_2O$, 99.9% D) are utilized and available from the Aldrich company of Milwaukee, Wis. All other chemicals utilized are of analytical grade and available from the Sigma company of St. Louis, Mo.

The samples are dissolved in the running buffer, consisting of $D_2O$ and 20 mM $Na_3Po_4$ or 60 mM $D_3BO_3$. The pDs are adjusted with DCL or NaOd. The pD values are measured using a conventional pH meter (model 720A available from the Orion company of Boston, Mass.) by adding 0.4 unit to the pH readings.

Figure 3A:
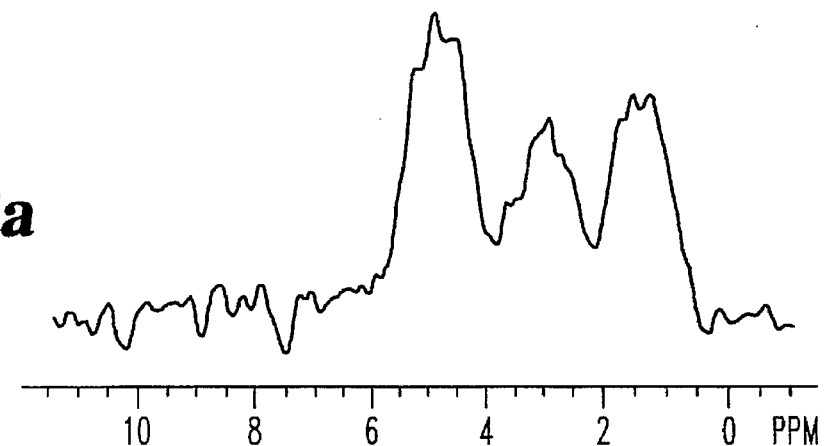

FIGS. 3a–3e illustrate the NMR spectrum collected over a 4000 Hz spectral width for a 0.8M sample of arginine (5 nL in detection cell) and with an capillary member 16 having a 75 μm inside diameter. In FIG. 3a, a thin walled capillary member 16 of approximately 145 μm outside diameter is used with a 1.2 mm microcoil 18 made from 25 μm AU wire (128) scans and with a resulting line width of over 200 Hz.

Figure 3B:
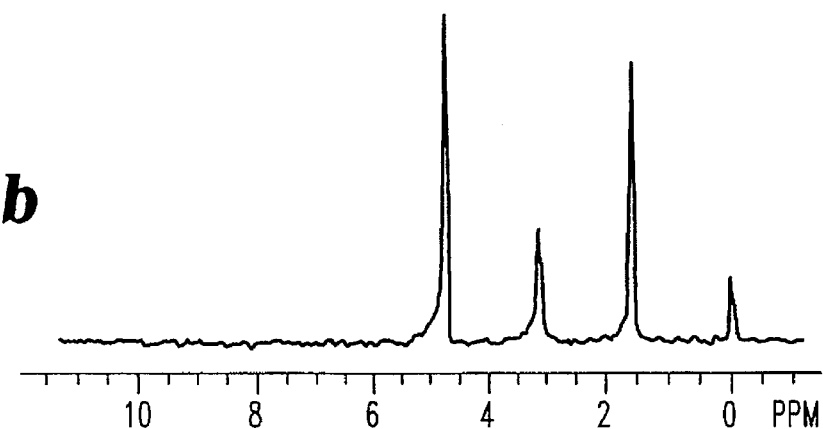

In FIG. 3b, a thick walled capillary member 16 of approximately 350 μm outside diameter is used with a 1.1 mm microcoil 18 made from 63 μm Cu wire (32 scans). The resulting line width substantially narrows to 11 Hz. The narrowest line widths observed for the microcoils 18 of the present invention were approximately 7 Hz at 7.05 T (300 MHz$^1$H).

Figure 3C:
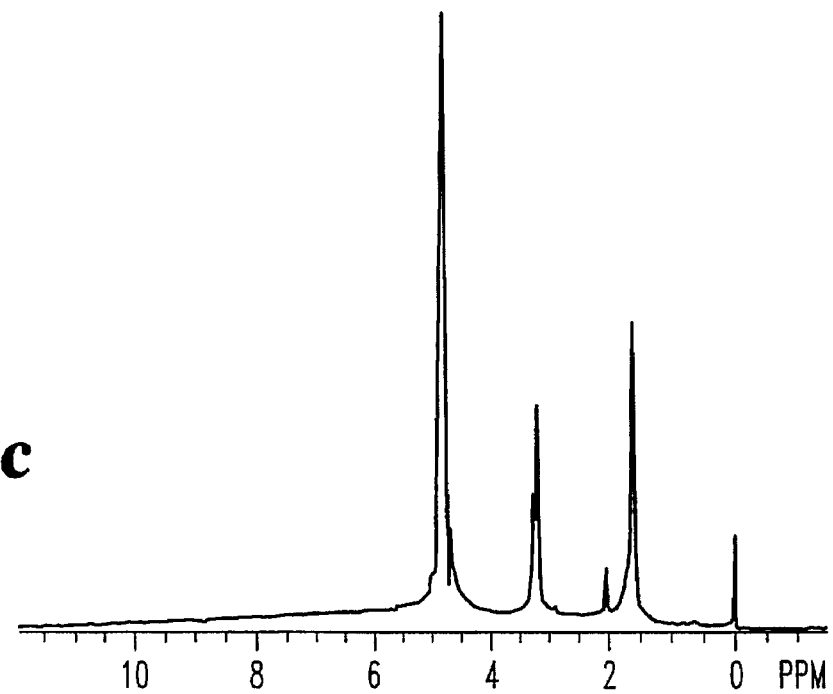

For comparison to a "large volume" commercially available system, FIG. 3c illustrates a reference NMR spectrum of 35 mM arginine for four scans from a General Electric GN-300 MHz probe (SNR of about 75) which did not include the microcoil 18 of the present invention. Although the overall SNR obtained from the method and apparatus of the present invention is less than the commercial system, the greater than 3 order of magnitude reduction in sample volume is accompanied by only about a 20-fold loss in SNR.

As FIG. 3b illustrates, a signal-to-noise ratio of 65 is obtained on the 4 nmol arginine sample. This yield a limit of detection (LOD) (SNR=3) of 0.2 nmol or 35 ng for arginine for 32 scans and 64 s acquisition time.

The present method and apparatus enables NMR spectra to be obtained from as little as 1 μg of sample provided the sample has high solubility.

Figure 4:
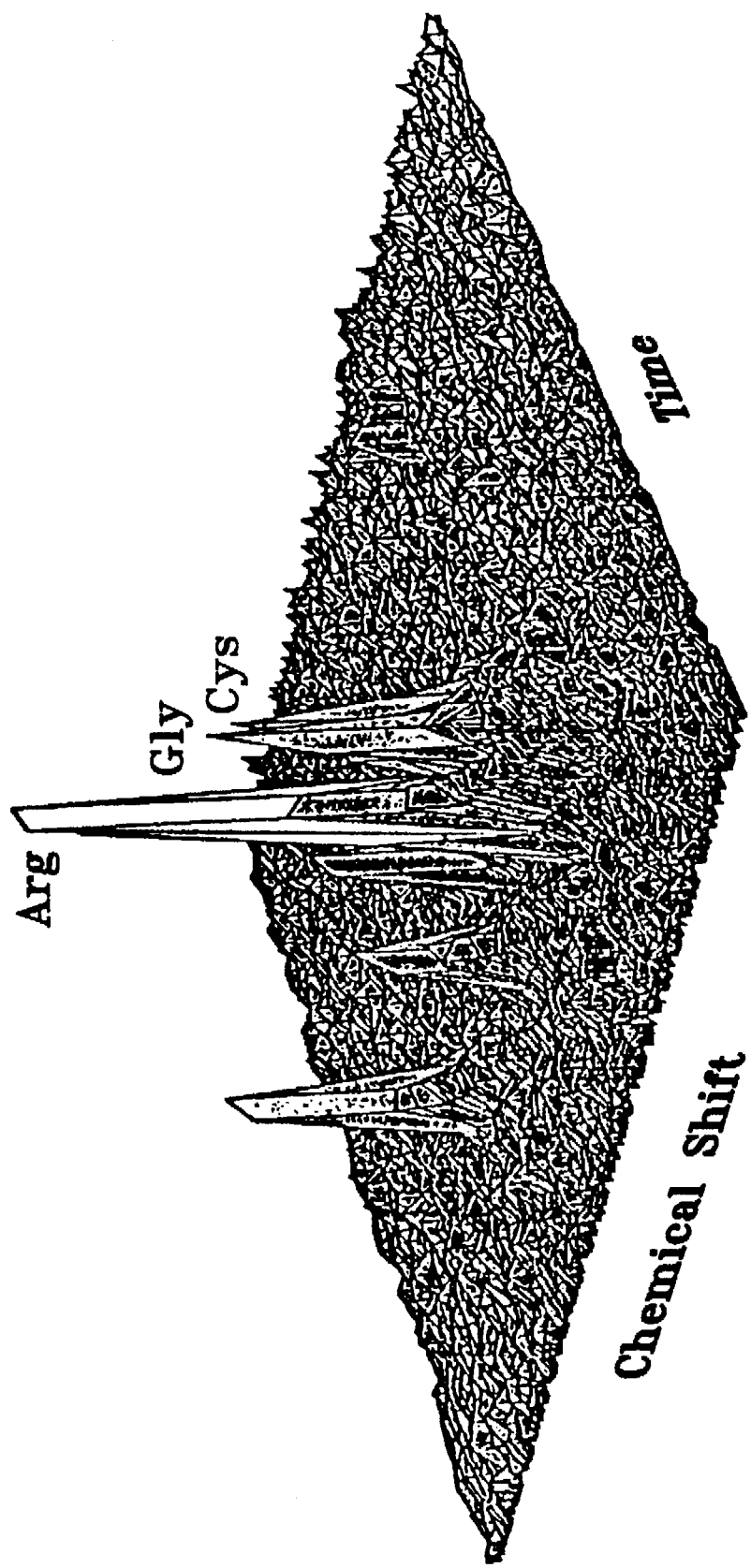
FIG. 4 is a three-dimensional graph of an NMR spectra obtained by the method and apparatus of the present invention.
Figure 5A:
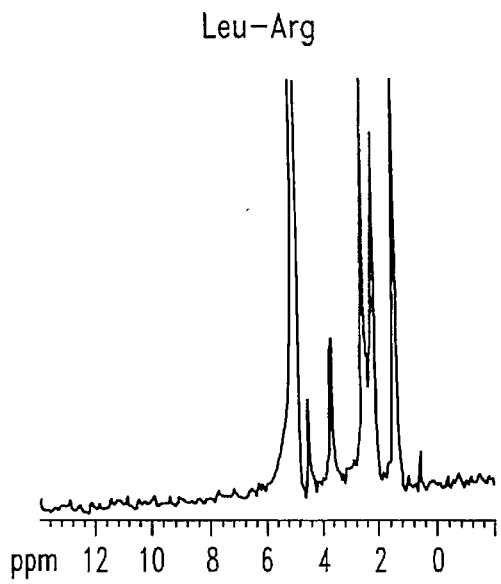
FIGS. 5a–5d are graphs of NMR spectra of various peptides obtained using the apparatus of the present invention and static NMR.
Figure 5B:
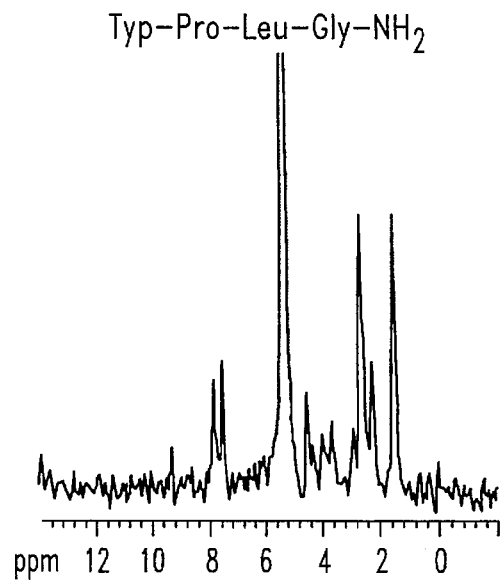
Figure 5C:
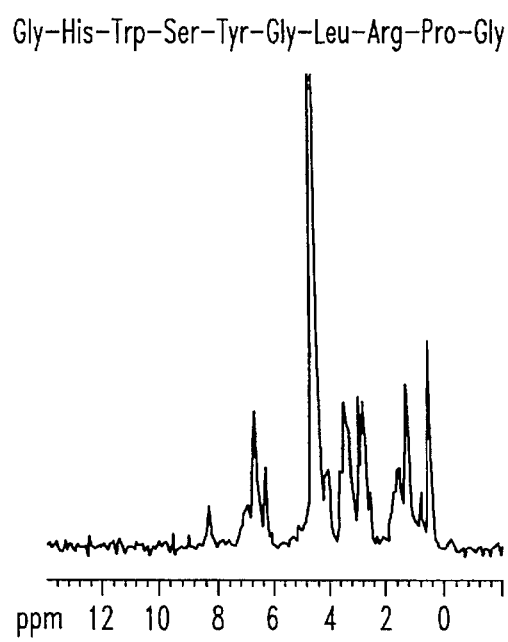
Figure 5D:
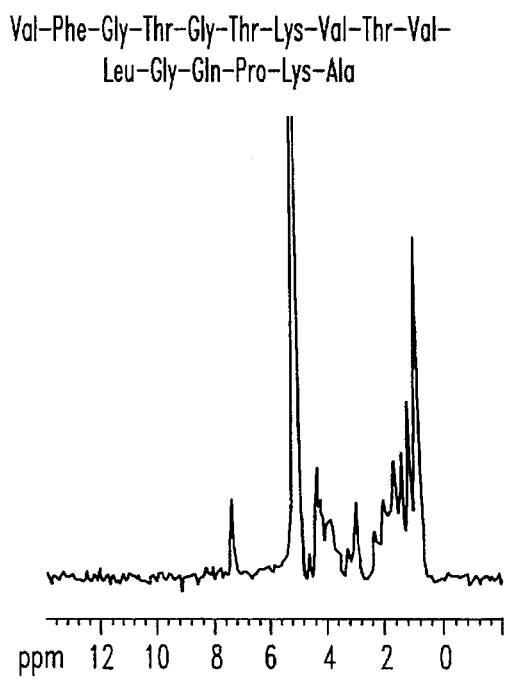

FIG. 4 illustrates a three-dimensional NMR electropherogram of a three amino acid mixture. The separation was carried out in a 48 cm long (40 cm to the detector) 75 μm I.D./350 μm O.D fused silica capillary member 16 provided by Polymicro Technologies of Phoenix, Ariz. The samples were dissolved in a running buffer of 20 mM $Na_3PO_4$ dissolved in $D_2O$, with the pD adjusted with DCL to 7.

It is to be noted that by using a capillary member 16 having a slightly larger diameter a 50-nL volume sample also has been detected for both static NMR and LC applications. FIGS. 5a–5d illustrate the NMR spectra acquired during static use for the microcoil 18 for a series of peptides having between 2 and 16 amino acids.

Figure 6A:
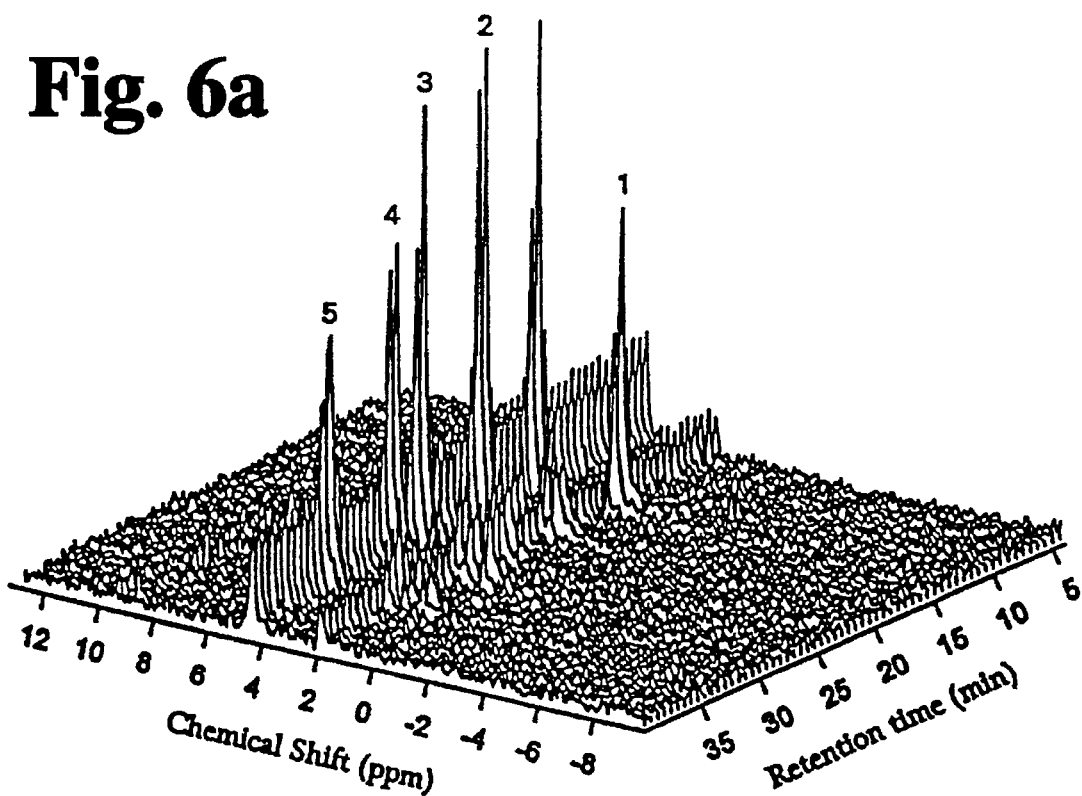
FIGS. 6a and 6b are graphs demonstrating on-line detection in LC.
Figure 6B:
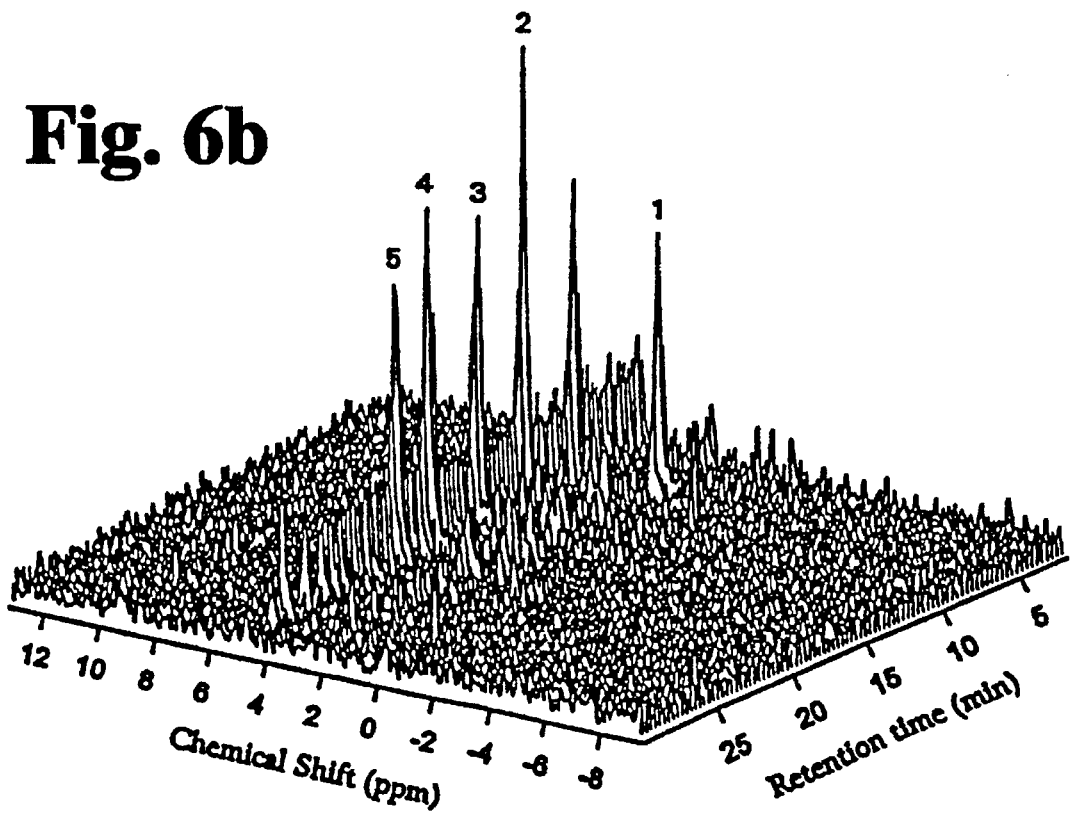

FIGS. 6a and 6b illustrate on-line detection with the microcoil 18 of the present invention where separation was accomplished using LC rather then CE. These figures illustrate two-dimensional chromatograms of (1) 67 mM alanine, (2) 33 mM arginine, (3) 34 mM lysine, (4) 17 mM Leu-Arg and (5) 11 mM Oxytocin. Each NMR spectrum is 256 scans (0.03-s delay) in FIG. 6a and 128 scans in FIG. 6b of a 512 point, 4000 Hz spectral width NMR acquisitions. The LC flow rate is 30 μl/min in FIG. 6a and 50 μl/min in FIG. 6b.

Although the line widths are slightly larger, optimization of these systems should produce reduced line widths.

Figure 7:
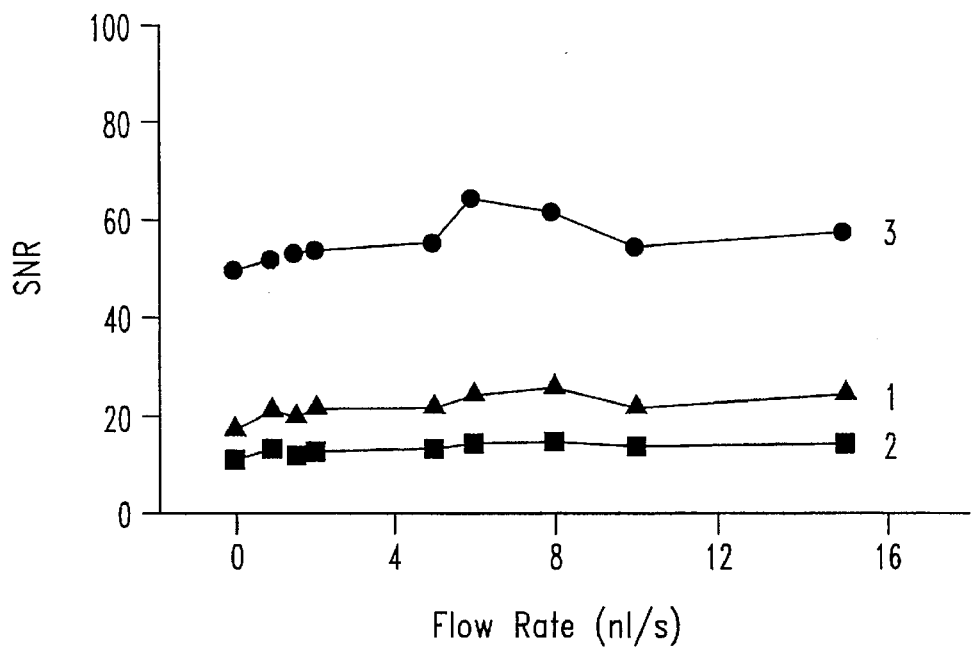
FIG. 7 is a graph illustrating the influence on SNR of dynamic flow rates.
Figure 8:
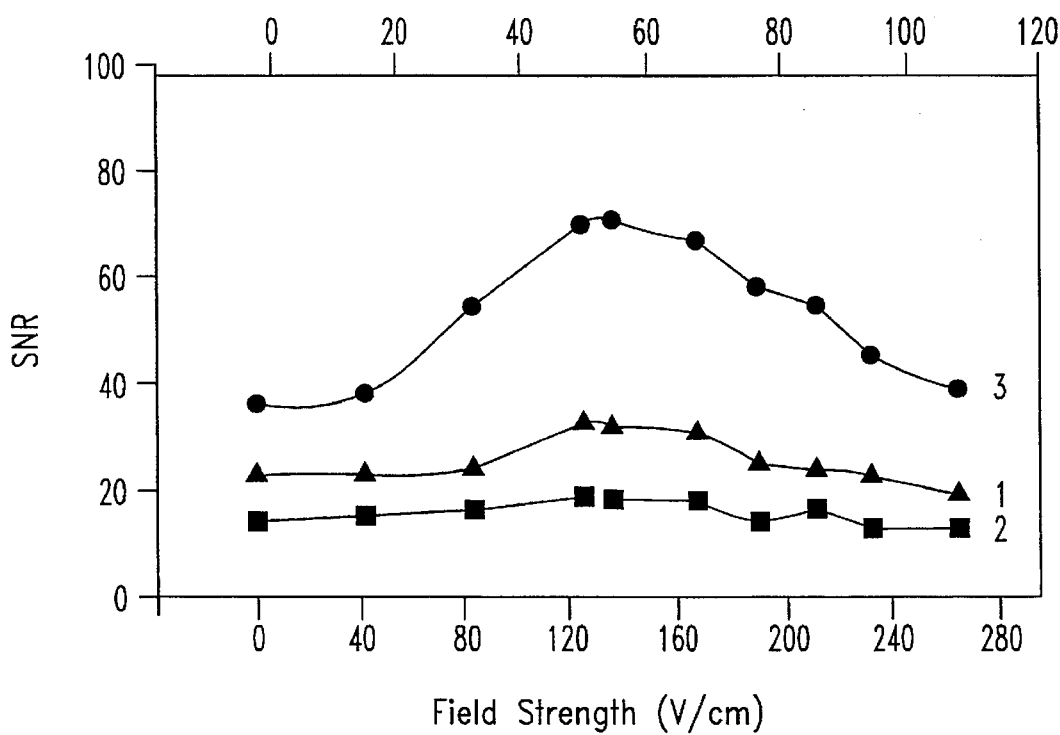
FIG. 8 is a graph illustrating the influence of applied voltage on SNR.

With regard to flowing NMR measurements, the electrophoretic current, voltage and flow rate all effect the observed NMR band intensity and line width. FIG. 7 illustrates the SNR for each of three arginine bands compared for dynamic flow (syringe pump) for flow rates of 0–15 nL/s while FIG. 8 illustrates the SNR for electrically induced flow with field strength between 0 and 260 V/cm which roughly correspond to flow rates of 0–10 nL/s.

The improvement in SNR under dynamic flow appears to be due to the reduction in saturation since the sample volume is constantly replaced by new nuclei. At the highest flow rates, an even greater improvement is possible by significantly decreasing the pulse delay as the sample is replaced in the detection cell every ~300 ms. In this way, a greater number of scans can be obtained for each analyte for a given acquisition time.

For these faster flow rates, the line widths should be at least 3 Hz regardless of the sample's $T_2$ (see equation 2). Due to the minimum line width of the microcoil 18, variations in the line widths as a function of flow rate do not occur. At flow rates above 50 nL/s, however, flow-induced line-broadening effects are expected.

Figure 9A:
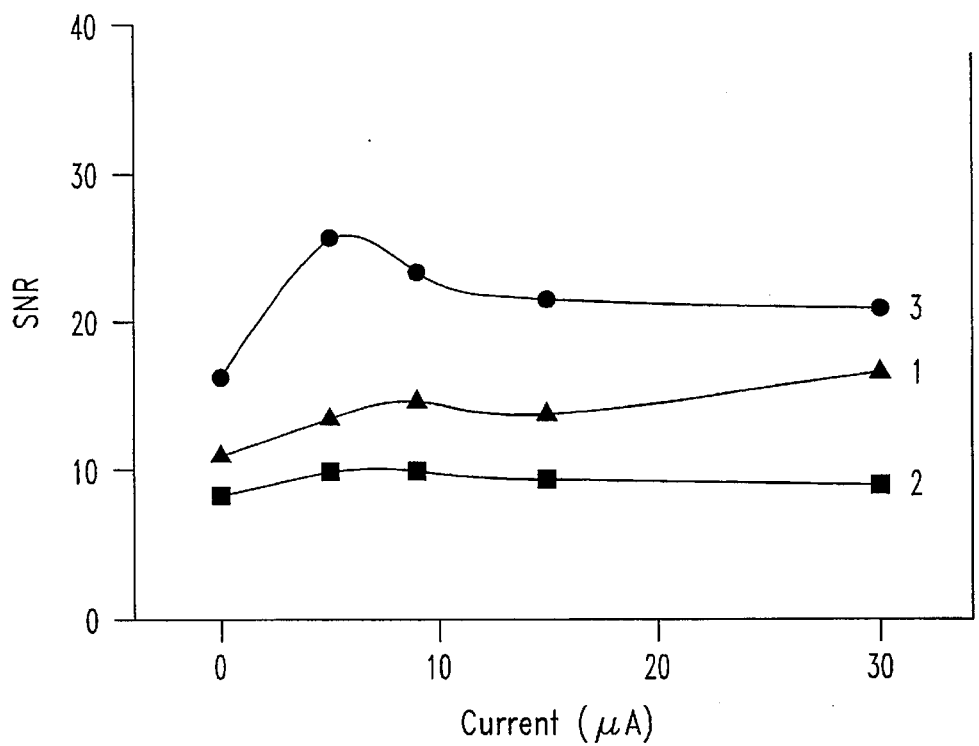
FIGS. 9a and 9b are graphs illustrating the influence of capillary current on SNR and line width, respectively.

To determine the SNR behavior of arginine under the influence of electric field/current, two different experiments can be performed. As FIG. 8 illustrates, the concentration of running buffer/electrolyte is kept constant and the current linearly increases as the voltage is increased from 0 to 260 V/cm. In FIG. 9a, different varied concentrations of the electrolyte are used so that different currents are flowing at a constant applied field of 125 V/cm.

As these figures illustrate, the influence of current/voltage on the SNR of the three arginine bands is more complex than under dynamic flow with the individual bands showing different SNR dependence on applied field. At the field strengths of <140 V/cm in FIG. 8, the SNR increases as the current increases.

The maximum SNR is observed at ~56 μA (140 V/cm). Under dynamic flow, the optimum SNR is obtained at a flow rate of ~8 nL/s corresponding to a mobility of arginine ions under 300 V/cm field strength. The noise level remains essentially constant under the dynamic flow while it increases slightly under the influence of current/applied field.

Resistive healing of the solution can be a problem at higher currents which should degrade the SNR at the highest currents. As FIG. 8 illustrates, a 30% reduction in SNR is observed at a current of 100 μA as compared to the SNR at 50 μA.

Although the magnitude of the current inside the capillary member 16 is small, the steady-state current density is higher than expected. If the SNR is affected by the internal current-induced magnetic field, it should be reflected in line width broadening.

Figure 9B:
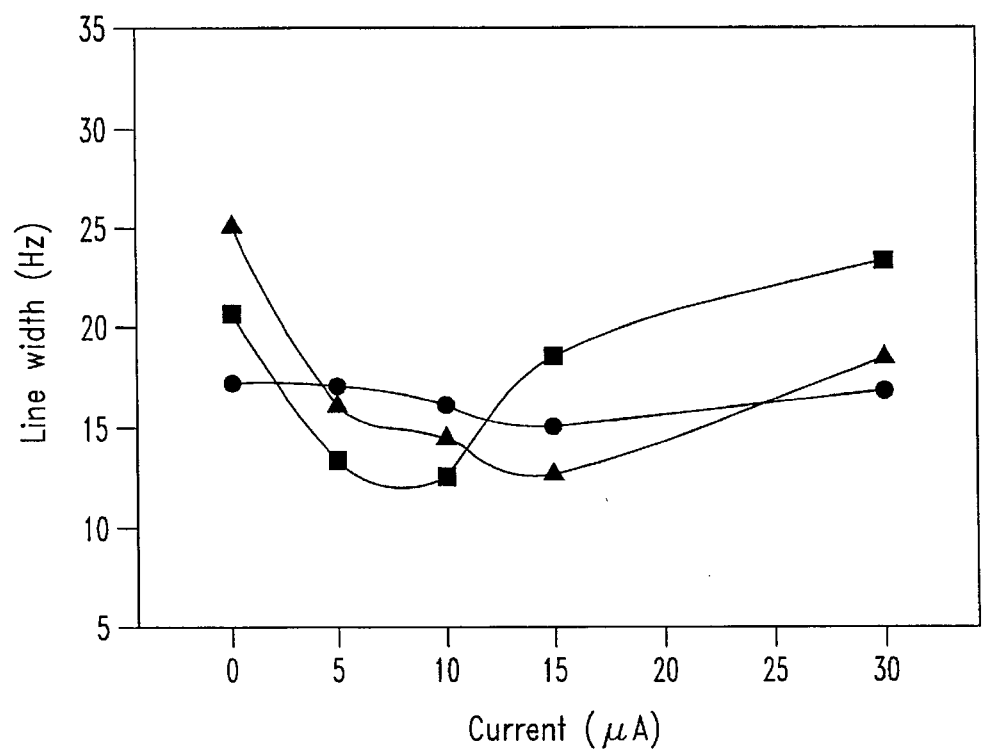

With the microcoil 18, as FIGS. 9a and 9b illustrate, the observed line widths for static measurement are approximately 16–25 Hz for the three arginine bands. A significant reduction in line width as a function of current occurs depending on the particular resonance, while in dynamic flow experiments no such variations occur.

For example, in FIG. 9b the line width of band 1 is reduced from 25 to 12 Hz as the current is increased form 0 to 15 μA. The variation of line width as a function of current explains some of the observed variations in SNR. It is expected that as the line is narrowed, the peak height will increase to keep the integrated peak area constant, thus improving the SNR. As FIGS. 9a and 9b illustrate, other factors also are important.

From the foregoing, it will be observed that numerous modifications and variations can be effected without departing from the true spirit and scope of the novel concept of the present invention. It will be understood that no limitation with respect to the specific embodiment is intended or should be inferred. The disclosure is intended to cover, by the appended claims, all such modifications as fall within the scope of the claims.

What is claimed is:

1. A method of structural elucidation and determination of an analyte, comprising the steps of:

providing a sample of an analyte;

separating said analyte sample into nanoliter size (<μL) samples; and analyzing said nanoliter size samples with a nuclear magnetic resonance (NMR) spectrometer.

2. The method in accordance with claim 1 including providing a microcoil for operable communication with said NMR spectrometer to enhance the sensitivity of said NMR spectrometer.

3. The method in accordance with claim 1 wherein said sample size is less than 200 nanoliters.

4. The method in accordance with claim 1 wherein said step of analyzing said sample with said NMR spectrometer is accomplished in less than 5 minutes.

5. The method in accordance with claim 1 wherein said step of separating said sample is provided by capillary electrophoresis.

6. The method in accordance with claim 1 wherein said step of separating said sample is provided by liquid chromatography.

7. The method in accordance with claim 1 wherein said step of separating said sample is provided by capillary liquid chromatography.

8. An apparatus for structural elucidation and determination of an analyte, comprising:

microseparation means for separating said analyte into nanoliter size samples;

a nuclear magnetic resonance (NMR) spectrometer for measuring the nanoliter size samples provided by said means for separating; and means for increasing the sensitivity of said NMR spectrometer to provide the sensitivity needed for effectively analyzing said nanoliter size samples.

9. The apparatus in accordance with claim 8 wherein said means for increasing the sensitivity of said NMR spectrometer includes an RF microcoil having a predetermined inside diameter selected for operable cooperation with said microseparation means and said NMR spectrometer, for providing enhanced sensitivity and improved signal-to-noise ratio of said NMR spectrometer, and for enabling said NMR spectrometer to analyze said nanoliter size samples of analyte.

10. The apparatus in accordance with claim 9 wherein said microseparation means are capillary electrophoresis.

11. The apparatus in accordance with claim 9 wherein said microseparation means are liquid chromatography.

12. The apparatus in accordance with claim 9 wherein said inside diameter of said RF microcoil is less than 1 mm.

13. The apparatus in accordance with claim 9 wherein said microseparation means include capillary electrophoresis means having a capillary member formed from fused silica, said microcoil being formed from wire wound about said capillary member in a detection region thereof.

14. The apparatus in accordance with claim 13 including a NMR probe in operable communication with said NMR spectrometer wherein said RF microcoil is positioned within said NMR probe substantially perpendicular to the magnetic field of said NMR spectrometer.

15. The apparatus in accordance with claim 9 wherein said microcoil is a multi-turn solenoidal coil.

16. The apparatus in accordance with claim 9 wherein said microcoil is a planar, lithographic coil.

17. The apparatus in accordance with claim 9 wherein said microcoil is fabricated onto a capillary or tubular structure forming said microseparation means through which said analyte flows.

18. The apparatus in accordance with claim 9 wherein said microcoil is fabricated onto a substrate forming said microseparation means across which said analyte flows.

19. The apparatus in accordance with claim 18 wherein said microcoil is fabricated onto a substrate onto which has been etched or grooved channels to serve as said capillaries through which said analytical compound flows.

* * * * *